United States Patent
Rodder et al.

(10) Patent No.: US 9,466,669 B2
(45) Date of Patent: Oct. 11, 2016

(54) MULTIPLE CHANNEL LENGTH FINFETS WITH SAME PHYSICAL GATE LENGTH

(71) Applicant: Samsung Electronics Co., Ltd., Suwon-si (KR)

(72) Inventors: Mark S. Rodder, Dallas, TX (US); Borna Obradovic, Leander, TX (US); Rwik Sengupta, Pflugerville, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/683,926

(22) Filed: Apr. 10, 2015

(65) Prior Publication Data
US 2015/0318282 A1 Nov. 5, 2015

Related U.S. Application Data

(60) Provisional application No. 61/988,850, filed on May 5, 2014.

(51) Int. Cl.
*H01L 29/66* (2006.01)
*H01L 21/3205* (2006.01)
*H01L 27/12* (2006.01)
(Continued)

(52) U.S. Cl.
CPC ........... *H01L 29/10* (2013.01); *H01L 21/0257* (2013.01); *H01L 21/823412* (2013.01); *H01L 21/823418* (2013.01); *H01L 21/823431* (2013.01); *H01L 21/823456* (2013.01); *H01L 27/0886* (2013.01); *H01L 29/08* (2013.01); *H01L 29/0847* (2013.01); *H01L 29/1033* (2013.01); *H01L 29/423* (2013.01); *H01L 29/42376* (2013.01)

(58) Field of Classification Search
CPC ........... H01L 27/0886; H01L 29/0847; H01L 29/1033; H01L 29/42376; H01L 29/66636; H01L 21/0257; H01L 21/3065; H01L 21/76254; H01L 21/823412; H01L 21/823431; H01L 21/823456
USPC .................. 257/192, 350, 368, 392, E27.06, 257/E27.112, E29.255, E29.273, E21.19, 257/E21.195, E21.252; 438/229, 275, 585, 438/706
See application file for complete search history.

(56) References Cited

U.S. PATENT DOCUMENTS

| 5,908,315 A | 6/1999 | Gardner et al. |
| 6,121,631 A | 9/2000 | Gardner |

(Continued)

FOREIGN PATENT DOCUMENTS

WO  WO 97/20352  6/1997

*Primary Examiner* — Dao H Nguyen
(74) *Attorney, Agent, or Firm* — Myers Bigel Sibley, P.A.

(57) ABSTRACT

A semiconductor structure includes a first finFET device including a first fin, a first gate electrode structure on sidewalls and an upper surface of the first fin, a first channel region beneath the first gate electrode structure, and first source and drain regions in the first fin on opposite sides of the first channel region, and a second finFET device including a second fin, a second gate electrode structure on sidewalls and an upper surface of the second fin, a second channel region beneath the second gate electrode structure, and second source and drain regions in the second fin on opposite sides of the second channel region. The second gate electrode structure has a second physical gate length that is substantially the same as a first physical gate length of the first gate electrode structure, and the second finFET device has a second effective channel length that is different from a first effective channel length of the first gate electrode structure.

9 Claims, 8 Drawing Sheets

(51) Int. Cl.
  *H01L 29/10*     (2006.01)
  *H01L 29/423*    (2006.01)
  *H01L 29/08*     (2006.01)
  *H01L 21/8234*   (2006.01)
  *H01L 21/02*     (2006.01)
  *H01L 27/088*    (2006.01)

(56) References Cited

U.S. PATENT DOCUMENTS

| | | |
|---|---|---|
| 6,175,136 B1 | 1/2001 | Okamura |
| 6,697,697 B2 | 2/2004 | Conchieri et al. |
| 6,750,673 B1 | 6/2004 | Huang et al. |
| 7,344,947 B2 | 3/2008 | Ivanov et al. |
| 7,442,613 B2 | 10/2008 | Hur et al. |
| 7,541,613 B2 | 6/2009 | Anderson et al. |
| 7,655,989 B2 | 2/2010 | Zhu et al. |
| 7,687,339 B1 | 3/2010 | Schultz et al. |
| 7,829,466 B2 | 11/2010 | Johnson et al. |
| 8,053,346 B2 | 11/2011 | Ryu et al. |
| 8,193,053 B2 | 6/2012 | Hisamoto et al. |
| 8,207,027 B2 | 6/2012 | Zhu et al. |
| 8,298,875 B1 | 10/2012 | Or-Bach et al. |
| 8,362,568 B2 | 1/2013 | Lin et al. |
| 8,482,323 B2 | 7/2013 | Eimitsu et al. |
| 8,513,131 B2 | 8/2013 | Cai et al. |
| 8,664,064 B2 | 3/2014 | Kim et al. |
| 9,263,551 B2 * | 2/2016 | Liu ............... H01L 29/66636 |
| 2002/0182757 A1 | 12/2002 | Conchieri et al. |
| 2004/0155293 A1 | 8/2004 | Hung et al. |
| 2005/0056892 A1 | 3/2005 | Seliskar |
| 2005/0173759 A1 | 8/2005 | Kim et al. |
| 2008/0070391 A1 | 3/2008 | Dokumaci et al. |
| 2008/0105900 A1 | 5/2008 | Joshi et al. |
| 2008/0258207 A1 * | 10/2008 | Radosavljevic .. H01L 29/41791 257/327 |
| 2008/0308880 A1 | 12/2008 | Inaba |
| 2010/0261328 A1 | 10/2010 | Kujirai |
| 2011/0068404 A1 | 3/2011 | Sugiura et al. |
| 2011/0309445 A1 * | 12/2011 | Kulkarni .......... H01L 21/26506 257/350 |
| 2012/0161238 A1 * | 6/2012 | Scheiper ........ H01L 21/823412 257/368 |
| 2012/0305893 A1 | 12/2012 | Colinge |
| 2013/0126981 A1 | 5/2013 | Ho et al. |
| 2013/0193513 A1 | 8/2013 | Bryant et al. |
| 2013/0248948 A1 | 9/2013 | Ma et al. |
| 2013/0285156 A1 | 10/2013 | Cai et al. |
| 2013/0334613 A1 | 12/2013 | Moroz |
| 2014/0070322 A1 | 3/2014 | Jacob et al. |
| 2014/0346617 A1 * | 11/2014 | Kim ................ H01L 29/66795 257/412 |

* cited by examiner

MULTIPLE CHANNEL LENGTH FINFETS WITH SAME PHYSICAL GATE LENGTH

CROSS-REFERENCE TO RELATED APPLICATION

This application claims priority under 35 U.S.C. §120 to U.S. Provisional Application Ser. No. 61/988,850, entitled MULTIPLE CHANNEL LENGTH FINFETS WITH SAME PHYSICAL GATE LENGTH INCLUDING BY DIFFERENT FIN RECESS PROFILE, filed in the USPTO on May 5, 2014, the disclosure of which is incorporated herein by reference in its entirety.

FIELD

Some embodiments of the inventive concept relate generally to semiconductor devices and, more particularly, to finFET semiconductor devices and methods of forming the same.

BACKGROUND

FIG. 1 is a cross sectional view schematically illustrating a conventional finFET semiconductor device formed using a recess etch. A conventional finFET semiconductor device 100 may include a substrate 105 and a channel region 120 having a fin shape 110 on the substrate 105. The conventional finFET semiconductor device 100 may include a gate stack 150 on atop surface of the channel region 120. The gate stack 150 extends down sidewall surfaces of the fin 110 between a source region 130 and a drain region 140. In this manner, an inversion or depletion region may be formed on opposing sidewalls of the channel 120 during device operation in response to a voltage applied to the gate stack 150.

The source and drain regions 130, 140 may be formed by removing semiconductor material on sides of the channel region 120 by a recess etch and epitaxially regrowing the source region 130 and the drain region 140 in the recessed regions on opposing sides of the channel region 120.

The effective channel length (Leff) of the device 100 is the net effective distance between the interior edges of the source and drain regions 130, 140. The source and drain regions 130, 140 generally have a doping level of about $1E19$ $cm^{-3}$ adjacent to the channel 120. The gate length (Lgate) of the device 100 refers to the width of the gate stack 150 excluding the sidewall spacers 152, which may be formed on opposite sides of the gate adjacent the source and drain regions 130, 140 to complete the gate electrode structure. Thus, in general, the effective channel length Leff and the gate length Lgate may not be equal.

A number of device characteristics of a finFET device may depend on the effective channel length Leff of the device. For example, the off-state (leakage) current Ioff of a finFET device and the on-state effective drive current, Ieff may decrease (increase) as the Leff of the device increases (decreases).

FIG. 2A is a cross sectional view schematically illustrating another conventional finFET semiconductor device formed without a recess etch, while FIG. 2B is a cross-sectional view taken along the line A-A' of FIG. 2A. In particular, a finFET semiconductor device 200 may include a substrate 205 and a channel region 220 having a fin shape 210 on the substrate 205. The finFET semiconductor device 200 includes a gate stack 250 on a top surface of the channel region 220. The gate stack 250 extends down sidewall surfaces of the fin 210. A source region 230 and a drain region 240 may be epitaxially grown around the fin 210 on opposing sides of the channel region 220. A sidewall spacer 252 may be formed on opposite sides of the gate stack adjacent the source and drain regions 230, 240.

SUMMARY

A semiconductor structure according to some embodiments includes a first finFET device including a first fin, a first gate electrode structure including a first gate metal and first sidewall spacers on sidewalls and an upper surface of the first fin, a first channel region beneath the first gate electrode structure, and first source and drain regions in the first fin on opposite sides of the first channel region; and a second finFET device including a second fin, a second gate electrode structure including a second gate metal and second sidewall spacers on sidewalls and an upper surface of the second fin, a second channel region beneath the second gate electrode structure, and second source and drain regions in the second fin on opposite sides of the second channel region. The first finFET device and the second finFET device have a same device type. The first gate electrode structure has a first physical gate length Lgate1 and the second gate electrode structure has a second physical gate length Lgate2 that is substantially the same as the first physical gate length Lgate1, and the first finFET device has a first effective channel length Leff1 and the second finFET device has a second effective channel length Leff2 that is different from the first effective channel length Leff1.

The second effective channel length Leff2 may be at least about 10% to 30% longer than the first effective channel length Leff1.

Each of the first source and drain regions may extend underneath the first gate electrode structure by a first distance that is greater than a second distance by which the second source and drain regions extend underneath the second gate electrode structure.

The second source and drain regions may have a rounded profile adjacent to the second channel region from a top of the second fin towards a bottom of the second fin.

The second effective channel length Leff2 may have an average effective channel length along a height of the second fin.

The first source and drain regions may have a first net doping concentration that is different than a second net doping concentration of the second source and drain regions.

The first source and drain regions may be formed in first fin recesses in the first fin and the second source and drain regions are formed in second fin recesses in the second fin, wherein each of the first fin recesses has a first vertical extent and a first lateral extent, wherein each of the second fin recesses has a second vertical extent and a second lateral extent. The second lateral extent may be different from the first lateral extent. In some embodiments, each of the first fin recesses in the first fin may have the same size as the second fin recesses in the second fin.

In some embodiments, the second lateral extent of each of the second fin recesses may be larger than the first lateral extent of each of the first fin recesses.

In some embodiments, each of the first fin recesses in the first fin may be more vertical than the second fin recesses in the second fin recess, and wherein each of the second recesses has a more rounded recess etch profile than the first recesses.

The first source and drain regions may be formed in first fin recesses in the first fin and the second source and drain regions may not be formed in recesses in the second fin.

The second source and drain regions may be formed as epitaxially regrown regions on the second fin.

The first source and drain regions may differ from the second source and drain regions by one or more of i) epitaxial material composition, and ii) position, distribution, concentration and/or grading of dopants relative to a position of gate electrodes, such that the first and second finFET devices have different effective channel lengths.

A method of forming a semiconductor structure according to some embodiments includes forming a first fin and a second fin, forming first and second gate electrode structures on the respective first and second fins, wherein the first and second gate electrode structures include respective first and second gate metals and first and second sidewall spacers, and wherein the first and second gate electrode structures have a first physical gate length, forming first and second source and drain recesses in the first and second fins on opposite sides of the respective first and second gate electrode structures, performing a first in-situ doped epitaxial material growth in the first source and drain recesses in the first fin to form first source and drain regions in the first fin, and performing a second in-situ doped epitaxial material growth in the second source and drain regions of the second fin to form second source and drain regions in the second fin.

A first spacing between inner edges of the first source and drain regions in the first fin is different than a second spacing between inner edges of the second source and drain regions in the second fin, the first and second spacing defining a first and second effective channel length for a first finFET device and a second finFET device, respectively, with the first effective channel length of the first finFET being different than the second effective channel length of the second finFET.

The first effective channel length of the first finFET device may be at least about 10% to 30% smaller than the second effective channel length of the second finFET device.

The method may further include forming a third fin; forming a third gate electrode structure on the third fin, the third gate electrode structure having the first physical gate length; and epitaxially regrowing a semiconductor material on the third fin to form respective third source and drain regions on the third fin without forming recesses in the third fin. The third source and drain regions define a third effective channel length that is different from the first and second effective channel lengths.

The second fin recess may be formed after the first source and drain regions are formed in the first fin recess in the first fin.

The second source and drain regions may have a rounded profile adjacent to a second channel region in the second fin from a top of the second fin towards a bottom of the second fin.

The second effective channel length Leff2 may have an average effective channel length along a height of the second fin.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

DETAILED DESCRIPTION OF THE EMBODIMENTS

Figure 1:
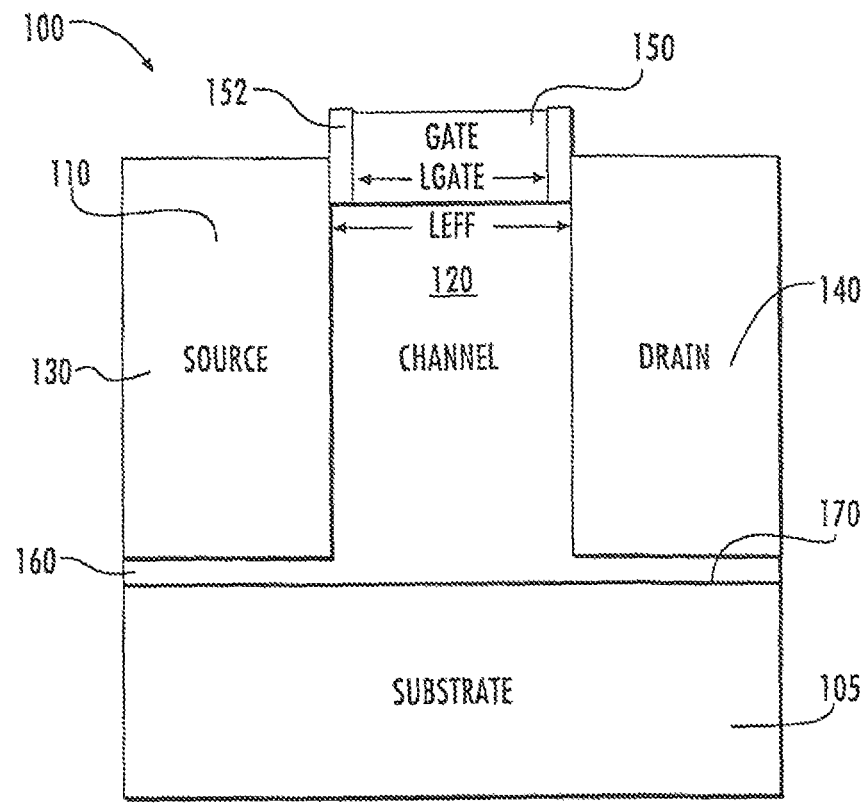
FIGS. 1 and 2A are cross sectional views schematically illustrating conventional finFET semiconductor devices.
Figure 2A:
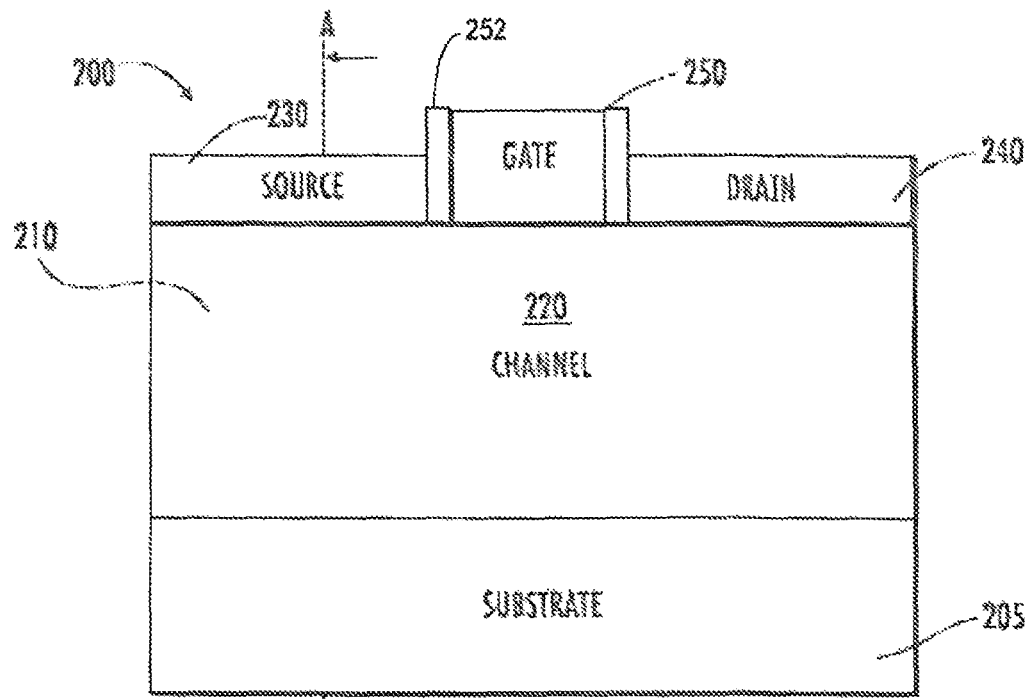
Figure 2B:
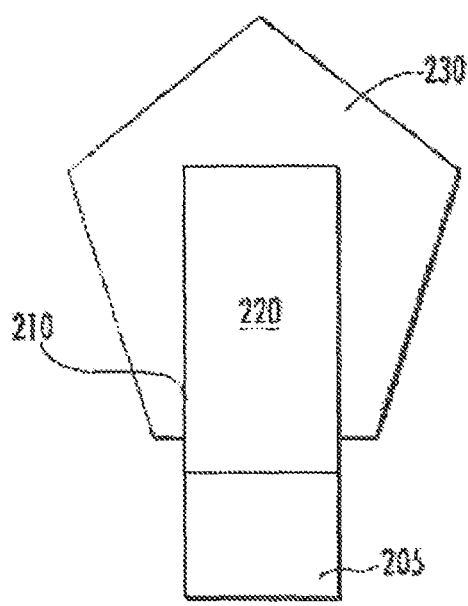
FIG. 2B is a cross-sectional view taken along the line A-A' of FIG. 2A.

Embodiments are described in detail with reference to the accompanying drawings. The inventive concept, however, may be embodied in various different forms, and should not be construed as being limited only to the illustrated embodiments set forth herein. Rather, these embodiments are provided as examples so that this disclosure will be thorough and complete, and will fully convey the concept of the inventive concept to those skilled in the art. Unless otherwise noted, like reference numerals denote like elements throughout the attached drawings and written description, and thus descriptions may not be repeated.

As noted above, several important device characteristics of a finFET semiconductor device depend on the effective channel length of the device. For example, the effective drive current Ieff and the off-state current Ioff of a finFET device may depend at least partially on the Leff of the device. The tradeoff between Ioff and Ieff may be different depending on the desired function of a particular device. For example, some transistors in a chip may require higher Ieff at the expense of tolerating higher Ioff, while other transistors may need reduced Ioff at the expense of tolerating lower Ieff, for example in non-critical speed paths.

There is a need for multiple effective channel lengths (Leff) of each FET type (nFET and pFET) in a product (chip), with a FET having a longer Leff used to lower the off-state leakage current (Ioff) in non-critical speed paths for a reduction in leakage power, and a FET having a shorter Leff used to increase the on-state effective drive current (Ieff) in critical speed paths for a reduction in delay time. In some chips, the longer Leff may be on the order of 10-30% longer than the shorter Leff. It is desired to form the FETs with different Ioff and Ieff but without an increase in the physical gate length (Lgate), and without an increase in contact resistance, Rc, due to lower contact area. If the longer Leff is due to a longer (physical) Lgate, then the space for a contact between two adjacent gates is reduced leading to higher Rc for the case in which the space for a contact between two adjacent gates is determined by a fixed CPP (contacted-poly-pitch) equal to the distance from a left edge of a gate to the right edge of an adjacent gate, with a space in-between. A reduced space, and thus a reduced space for a contact in-between two adjacent gates, can lead to too high Rc which may render the FET inoperable due to too low Ieff.

Some embodiments described herein provide semiconductor device structures including multiple finFET structures having the same gate lengths (Lgate) but different effective channel lengths (Leff). The semiconductor devices may include both nFET and/or pFET-type devices. Structures according to some embodiments may include both i) a longer Leff FET of each type (nFET or pFET) that have lower off-state current (Ioff) characteristics, and ii) a nominal, or shorter, Leff FET of each type with higher on-state effective drive current, Ieff, such that both Leff FETs may have substantially similar contact resistance Rc. Both the longer Leff FET and the shorter Leff FET may have the same gate length Lgate. Both types of FETs may meet desired Ieff, Ioff, and Rc metrics, which may be different for each type of device. FinFETs having different Leff may be formed by forming finFET structures with different fin recess profiles, or no recesses, in the source/drain regions in some embodiments. In other embodiments, FinFETs having different Leff may be formed by providing same or different fin recess profiles in the source/drain regions and different in-situ doped source/drain epitaxy profiles during source/drain epitaxial regrowth.

The different recess profiles can include substantially vertical or substantially rounded profiles. The recess profile of a source/drain region may be defined by the type and duration of the etch used to form the source/drain recess. For example, the source/drain etch may cause the recess to have a substantially vertical sidewall adjacent the gate or a rounded profile adjacent the gate. In addition, the source/drain etch may have both a vertical etch rate and a lateral etch rate. The vertical etch rate determines the depth of the recess etch, while the lateral etch rate determines how far under the gate stack and sidewall spacer the source/drain recess will extend. By controlling the etch process for different finFET structures, a desired amount of vertical and/or horizontal etching may be obtained, resulting in different recess profiles and/or different Leff of finFET devices formed on the same substrate.

Accordingly, the different recess profiles can further include profiles with (i) lateral extension beneath the gate stack and/or sidewall spacers or (ii) no lateral extension beneath the gate stack and/or sidewall spacers.

Devices having different fin recess profiles will have different effective gate lengths Leff, and thus will have different Ieff and Ioff characteristics, but may have substantially similar Rc characteristics, as desired.

Some particular embodiments including devices having different fin recess profiles resulting in different Leff finFETs, thus different Ieff and Ioff characteristics may include, for both pFET and nFET devices:

1) A first FET with a first recess etch, and a second FET with a second recess etch, wherein the first recess etch has more lateral etching than the second recess etch;

2) A first FET with a first recess etch, and a second FET with a second recess etch, wherein the first recess etch has a more vertical recess etch profile than the second recess etch, and the second recess etch has a more rounded recess etch profile; and 3) A first FET with a first recess etch, and a second FET with no recess etch.

For each of these embodiments, an in-situ doped source/drain epitaxial growth step may be performed after the fin recess etch, which may further affect the distance Leff between the interior edges of the doped source and drain regions.

For each of the embodiments described above, a third FET, or multiple FETs, can additionally be formed with any of the processes described in the embodiments above for the first and second FET.

Moreover, for each of the particular embodiments above, a doping process may be performed in any of the FETs described above, prior to and/or subsequent to the in-situ doped source/drain epitaxy, which can further affect the distance Leff between the interior edges of the source and drain regions. The doping process can be of the same doping type or different doping type as the in-situ doped source/drain epitaxy.

According to some embodiments, the source/drain regions corresponding to multiple channel length FETs can further include different in-situ doped source/drain doping profiles and/or different epitaxial materials in addition to different fin recess profiles. The different in-situ doped source/drain epitaxial materials may have different composition (e.g., different concentrations of Si, Ge, SiGe, C, Sn, and/or group III-V or II-VI elements, etc.) and different doping profiles (e.g., different concentrations, distributions, grading, junction depths, etc.). The different in-situ doped source/drain epitaxial materials can further result in a different Leff, and thus different Ieff and Ioff as desired. For a chip having multiple FETs with the same fin recess profile, the difference in in-situ doped source/drain epitaxial materials will cause the FETs to have different effective channel lengths.

In a particular embodiment, a first channel length FET is formed with a source/drain region utilizing a first fin recess etch characterized by a first vertical etch and first lateral recess etch and subsequent first source/drain epitaxial in-situ doped material growth in the first fin recess. A second channel length FET can be formed with a second fin recess etch characterized by a second vertical and second lateral recess etch and subsequent second source/drain epitaxial in-situ doped material growth in the second fin recess, but with the same physical gate length as the first channel length FET. A third channel length FET can be formed without a fin recess etch as used in the first and second channel length FETs, but with a source/drain epitaxial in-situ doped material growth that is the same as the first channel length FET and/or the same as the second channel length FET, and with the same physical gate length as the first and second channel length FETs.

A reason that multiple channel lengths can be formed by use of a first and/or second fin recess etch (and/or no fin recess etch), with no change in physical gate length is as follows. For FETs with a fin recess etch, there is a vertical recess etch that occurs and a lateral recess etch that can also occur, for which the lateral recess etch can result in an undercut of fin material in the source/drain regions, e.g., under the spacer adjacent to the gate prior to fin recess. Thus, for the case of a fin recess etch and a lateral recess etch, when source/drain in-situ doped epitaxial material growth occurs, the in-situ doping is closer to the gate edge than the outer edge of the spacer is by the amount of a lateral recess etch. In this manner, the channel length between inner edges of the source/drain in-situ doped epitaxial material growth in each of source/drain regions on opposite sides of the gate electrode is less than a channel length that would be otherwise be determined primarily by the outer edges of the sidewall spacer. Accordingly, a first channel length FET can have a first lateral recess etch, and a second channel length FET can have a second lateral recess etch, with the first lateral recess etch being different from the second lateral recess etch such that a first channel length FET has a channel length that is different from that of a second channel length FET.

For the case in which no fin recess etch occurs, there is no lateral recess etch. In a device with no fin recess etch, when the source/drain in-situ doped epitaxial material growth occurs, the in-situ doping may be aligned, e.g., to the outer edge of the sidewall spacer adjacent to each side of the gate, such that the channel length between inner edges of the source/drain in-situ doped epitaxial material growth in each of the source/drain regions is determined primarily by the distance between the outer edges of the sidewall spacers. By conducting a first and/or second fin recess etch, and/or no fin recess etch, devices having multiple different channel lengths may be formed on the same substrate. Since the physical gate length in each case is the same, multiple channel lengths of each device type may be formed without reducing the physical contact space between adjacent FET gates. The physical contact space is the space between outer edges of nearby spacers formed adjacent to nearby gates.

In some embodiments, any combination of first and/or second and/or third channel length devices can be utilized in a chip for the formation of at least two FETs of each device type having different channel lengths. Accordingly, the at least two FETs can be formed with, for example, a device utilizing a first recess etch and a device utilizing a second recess etch, or a device utilizing a first recess etch and a device utilizing no recess etch, or a device utilizing a first recess etch, a device utilizing a second recess etch and a device utilizing no recess etch.

While some embodiments provide devices having different channel lengths due to a difference in lateral recess etch depths, the different channel lengths of the first and second FETs can also be due to the a first FET having a substantially more vertical recess etch profile and the second FET having a substantially more rounded recess etch profile. The more rounded recess etch profile may thus have a progressively larger effective channel length along the fin height in comparison to the first FET. In the first FET, which has a more vertical recess etch profile, the effective channel length is generally constant along the fin height. The net effect of the larger effective channel length of the second FET is that the second FET may have a lower net leakage current Ioff.

And, as further described, the different (or same) fin recess profiles can be further combined with different in-situ doped source/drain doping profiles and/or epitaxial materials for the formation of at least two FETs of each device type having different channel lengths.

Figure 3:
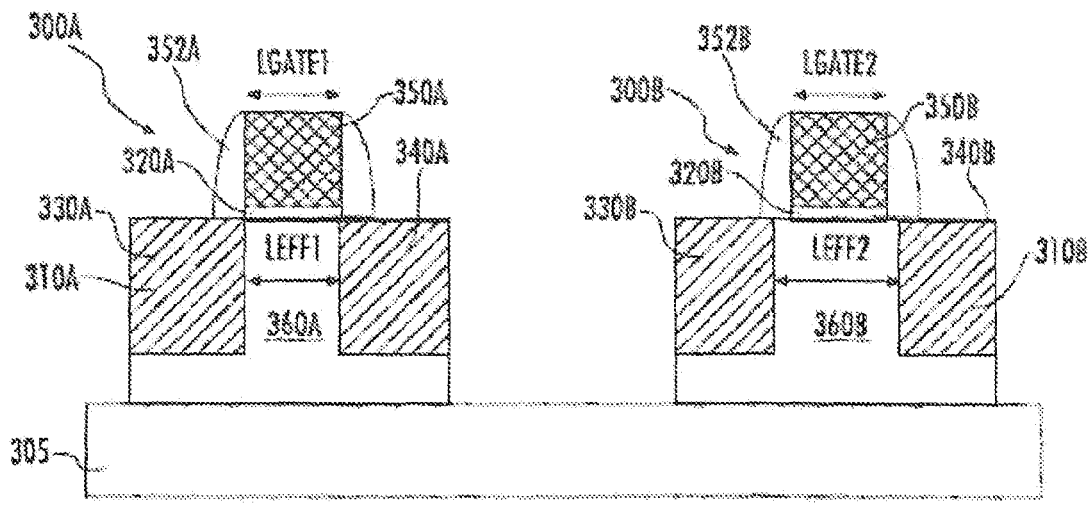
FIG. 3 is a cross sectional view schematically illustrating a finFET semiconductor device according to some embodiments of the inventive concept.

Devices according to some embodiments are illustrated in FIG. 3. As shown therein, a first finFET device 300A and a second finFET device 300B are formed on a common substrate 305. The first finFET device 300A includes a fin 310A including a source region 330A and a drain region 340A on opposite sides of a channel region 360A. A gate insulator 320A and gate stack 350A extend up and over the fin 310A. Sidewall spacers 352A are formed on opposite sides of the gate stack 350A on the upper and side surfaces of the fin 310A to complete the gate electrode structure. It is noted that in some cases, the gate insulator 320A may extend along the height of sidewall spacers 352A.

The first finFET device 300A has a first gate length Lgate1 and a first effective channel length Leff1. The effective channel length Leff1 is defined by the distance between the doped source and drain regions 330A, 340A. In the first finFET device 300A, the source and drain regions 330A, 340A extend laterally beneath the sidewall spacers 352A to define the effective channel length Leff1. In the embodiments shown in FIG. 3, the effective channel length Leff1 of the first finFET device 300A is about equal to the gate length Lgate1 of the device 300A. In some embodiments, however, the effective channel length Leff1 of the first finFET device 300A may be less than the gate length Lgate1 of the device 300A. That is, the source and drain regions 330A, 340A may extend laterally beneath the sidewall spacers 352A and beneath portions of the gate stack 350A. It is noted that in some cases, the gate insulator 320B may extend along the height of sidewall spacers 352B.

The second finFET device 300B includes a fin 310B including a source region 330B and a drain region 340B on opposite sides of a channel region 360B. A gate insulator 320B and gate stack 350B extend up and over the fin 310B. Sidewall spacers 352B are formed on opposite sides of the gate stack 350B on the upper and side surfaces of the fin 310B.

The second finFET device 300B has a second gate length Lgate2 and a second effective channel length Leff2. The second gate length Lgate2 of the second finFET device 300B may be about equal to the first gate length Lgate1 of the first finFET device 300A.

The effective channel length Leff2 is defined by the distance between the doped source and drain regions 330B, 340B. In the second finFET device 300B, the source and drain regions 330B, 340B extend laterally beneath the sidewall spacers 352B to define the effective channel length Leff2. However, the lateral extent of the source and drain regions 330B, 340B in the second finFET device 300B (i.e., the distance by which the source and drain regions 330B, 340B extend underneath the sidewall spacers 352B) is less than the lateral extent of the source and drain regions 330A, 340A in the first finFET device 300A, so that Leff2 is greater than Leff1.

In some embodiments, the second effective channel length Leff2 is at least about 1 to 5 nm (i.e., on the order of about 10-30%) longer than the first effective channel length Leff1. In some embodiments, a first device has a first effective channel length Leff1, a second device has a second effective channel length Leff2 that is about 2 to 3 nm longer than Leff1, and a third device has a third effective channel length Leff3 that is about 4 to 5 nm longer than Leff1.

The source and drain regions 330B, 340B in the second finFET device 300B may be formed by an etch process e.g. such as a reactive ion etch process as well known in the art, characterized by less lateral etching than the source and drain regions 330A, 340A in the first finFET device 300A.

Because the second finFET device 300B has a longer effective channel length, the second finFET device 300B may have lower Ioff characteristics.

Figure 4:
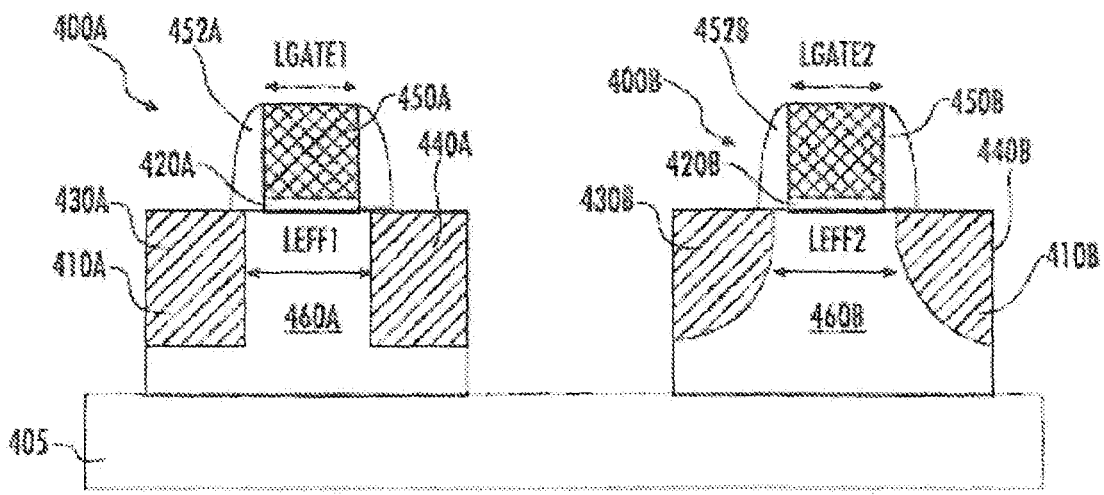
FIG. 4 is a cross sectional view schematically illustrating a finFET semiconductor device according to some embodiments of the inventive concept.

Devices according to further embodiments are illustrated in FIG. 4. As shown therein, a first finFET device 400A and a second finFET device 400B are formed on a common substrate 405. The first finFET device 400A includes a fin 410A including a source region 430A and a drain region 440A on opposite sides of a channel region 460A. A gate insulator 420A and gate stack 450A extend up and over the fin 410A. Sidewall spacers 452A are formed on opposite sides of the gate stack 450A on the upper and side surfaces of the fin 410A.

The first finFET device 400A has a first gate length Lgate1 and a first effective channel length Leff1. The effective channel length Leff1 is defined by the distance between the doped source and drain regions 430A, 440A. In the first finFET device 400A, the source and drain regions 430A, 440A extend laterally beneath the sidewall spacers 452A to define the effective channel length Leff1. In the embodiments shown in FIG. 4, the effective channel length Leff1 of the first finFET device 400A is slightly longer than the gate length Lgate1 of the device. In some embodiments, however, the effective channel length Leff1 of the first finFET device 400A may be less than the gate length Lgate1 of the device. That is, the source and drain regions 430A, 440A may extend laterally beneath the sidewall spacers 452A and beneath portions of the gate stack 450A.

The second finFET device 400B includes a fin 410B including a source region 430B and a drain region 440B on opposite sides of a channel region 460B. A gate insulator 420B and gate stack 450B extend up and over the fin 410B. Sidewall spacers 452B are formed on opposite sides of the gate stack 450B on the upper and side surfaces of the fin 410B.

The second finFET device 400B has a second gate length Lgate2 that is about equal to the first gate length Lgate1 of the first finFET device 400A. However, because the source and drain regions 430B, 440B of the second finFET device 400B have a more rounded (less vertical) profile, the effective channel length Leff2 is greater than Leff1.

Because of the curved profile of the source/drain regions 430B, 440B in the second finFET device 400B, the channel length varies along the height of the fin 410B. Thus, the effective channel length Leff2 is defined by the average lateral distance between the doped source and drain regions 430B, 440B. As a result, Leff2 is greater than Leff1.

Figure 5A:
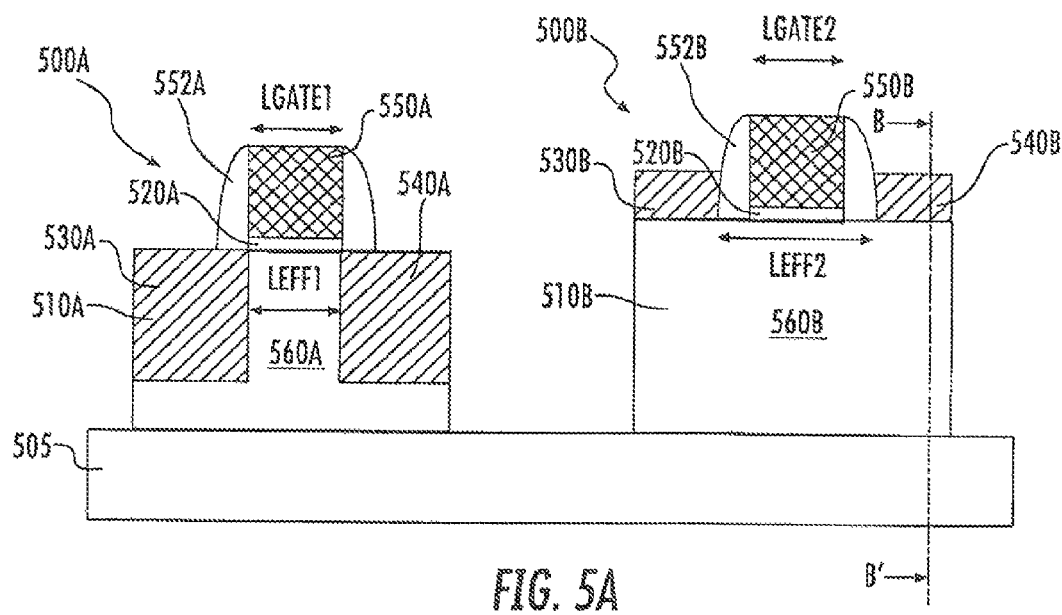
FIG. 5A is a cross sectional view schematically illustrating a finFET semiconductor device according to some embodiments.
Figure 5B:
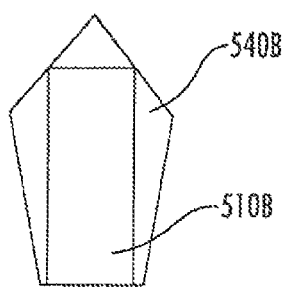
FIG. 5B is a cross-sectional view taken along the line B-B' of FIG. 5A.

The source and drain regions 430B, 440B in the second finFET device 400B may be formed by, e.g., a reactive ion etch process that results in a more rounded profile than the source and drain regions 430A, 440A in the first finFET device 400A, Devices according to further embodiments are illustrated in FIGS. 5A and 5B, where FIG. 5B is a cross section taken along line B-B' of Figure 5A. As shown therein, a first finFET device 500A and a second finFET device 500B are formed on a common substrate 505. The first finFET device 500A includes a fin 510A including a source region 530A and a drain region 540A on opposite sides of a channel region 560A. A gate insulator 520A and gate stack 550A extend up and over the fin 510A. Sidewall spacers 552A are formed on opposite sides of the gate stack 550A on the upper and side surfaces of the fin 510A.

The first finFET device 500A has a first gate length Lgate1 and a first effective channel length Leff1. The effective channel length Leff1 is defined by the distance between the doped source and drain regions 530A, 540A. In the first finFET device 500A, the source and drain regions 530A, 540A extend laterally beneath the sidewall spacers 552A to define the effective channel length Leff1. In the embodiments shown in FIG. 5A, the effective channel length Leff1 of the first finFET device 500A is about equal to the gate length Lgate1 of the device. In some embodiments, however, the effective channel length Leff1 of the first finFET device 500A may be less than the gate length Lgate1 of the device. That is, the source and drain regions 530A, 540A may extend laterally beneath the sidewall spacers 552A and beneath portions of the gate stack 550A. In other embodiments, the source and drain regions 530A, 540A may not extend beneath the sidewall spacers 552A.

The second finFET device 500B includes a fin 510B including a source region 530B and a drain region 540B on opposite sides of a channel region 560B. A gate insulator 520B and gate stack 550B extend up and over the fin 510B. Sidewall spacers 552B are formed on opposite sides of the gate stack 550B on the upper and side surfaces of the fin 510B.

The second finFET device 500B is not formed by etching recesses for the source/drain regions, but rather is formed by epitaxial regrowth of the source/drain material on the fin.

The second finFET device 500B has a second gate length Lgate2 that is about equal to the first gate length Lgate1 of the first finFET device 500A. However, because the source and drain regions 530B, 540B of the second finFET device 500B are formed by epitaxial regrowth, the effective channel length Leff2 is greater than Leff1.

Figure 6:
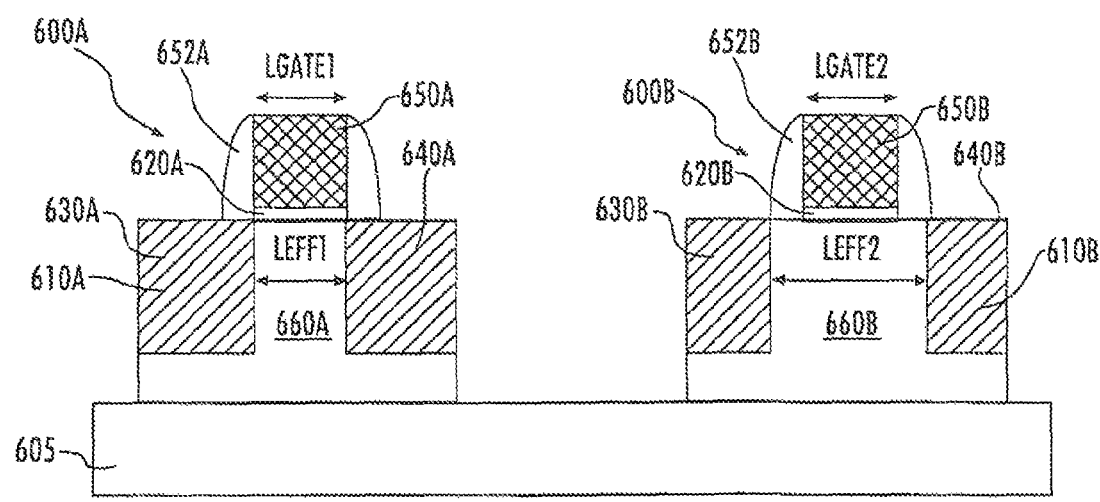
FIG. 6 is a cross sectional view schematically illustrating a finFET semiconductor device according to some embodiments of the inventive concept.

Devices according to still further embodiments are illustrated in FIG. 6. As shown therein, a first finFET device 600A and a second finFET device 600B are formed on a common substrate 605. The first finFET device 600A includes a fin 610A including a source region 630A and a drain region 640A on opposite sides of a channel region 660A. A gate insulator 620A and gate stack 650A extend up and over the fin 610A. Sidewall spacers 652A are formed on opposite sides of the gate stack 650A on the upper and side surfaces of the fin 610A.

The first finFET device 600A has a first gate length Lgate1 and a first effective channel length Leff1. The effective channel length Leff1 is defined by the distance between the doped source and drain regions 630A, 640A. In the first finFET device 600A, the source and drain regions 630A, 640A extend laterally beneath the sidewall spacers 652A to define the effective channel length Leff1. In the embodiments shown in FIG. 6, the effective channel length Leff1 of the first finFET device 600A is about equal to the gate length Lgate1 of the device.

The second finFET device 600B includes a fin 610B including a source region 660B and a drain region 640B on opposite sides of a channel region 660B. A gate insulator 620B and gate stack 650B extend up and over the fin 610B. Sidewall spacers 652B are formed on opposite sides of the gate stack 650B on the upper and side surfaces of the fin 610B.

The second finFET device 600B has a second gate length Lgate2 and a second effective channel length Leff2. The second gate length Lgate2 of the second finFET device 600B may be about equal to the first gate length Lgate1 of the first finFET device 600A.

The effective channel length Leff2 is defined by the distance between the doped source and drain regions 630B, 640B. In the second finFET device 600B, the source and drain regions 630B, 640B extend laterally beneath the sidewall spacers 652B to define the effective channel length Leff2. However, the lateral extent of the source and drain regions 630B, 640B in the second finFET device 600B (i.e., the distance by which the source and drain regions 630B, 640B extend underneath the sidewall spacers 652B) is less than the lateral extent of the source and drain regions 630A, 640A in the first finFET device 600A, so that Leff2 is greater than Leff1.

The source and drain regions 630B, 640B in the second finFET device 600B may be formed by an etch process characterized by less lateral etching than the source and drain regions 630A, 640A in the first finFET device 600A.

In addition, the source and drain regions 630B, 640B in the second finFET device 600B may be formed using different epitaxial materials or doping than are used in the first finFET device 600A, which may further affect the effective gate length Leff2 of the second finFET device 600B relative to the first finFET device 600A. For example, different epitaxial materials or doping can include different composition (e.g., different concentrations of Si, Ge, SiGe, C, Sn, and/or group III-V or II-VI elements, etc.) and different doping profiles (e.g., different concentrations, distributions, grading, junction depths, etc.), a net effect being to affect the distance between the doped source and drain regions 630B, 640B and thus the effective channel length.

Figure 7A:
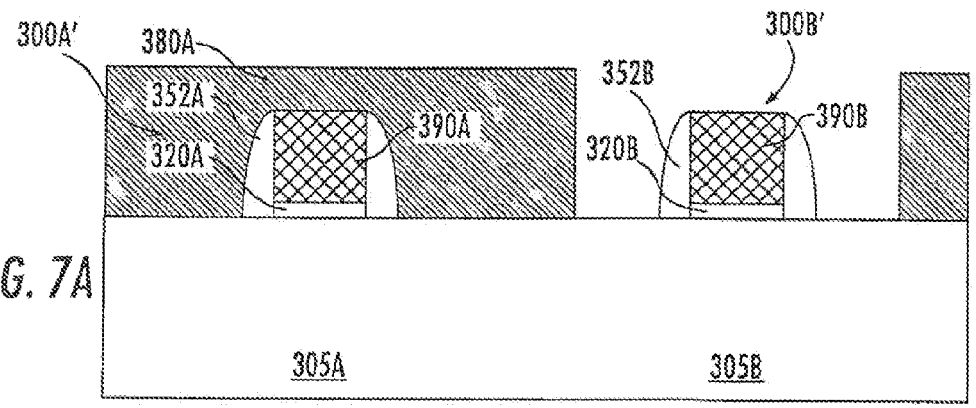
FIGS. 7A-7D are cross-sectional views illustrating stages of a method of manufacturing a finFET semiconductor device according to some embodiments.

Operations according to some embodiments are illustrated in FIGS. 7A to 7D. Referring to FIG. 7A, first and second precursor structures 300A', 300B' for finFET devices are formed on first and second fins 305A, 305B on a common substrate (not shown).

The precursor structures 300A', 300B' include gate insulators 320A, 320B, dummy gates 390A, 390B, and sidewall spacers 352A, 352B that extend up and over the respective fins 305A, 305B. The first structure 300A' is covered with an etch mask 380A. The etch mask 380A (or a different etch mask) is formed to expose the source/drain regions of the second structure 300B'.

Figure 7B:
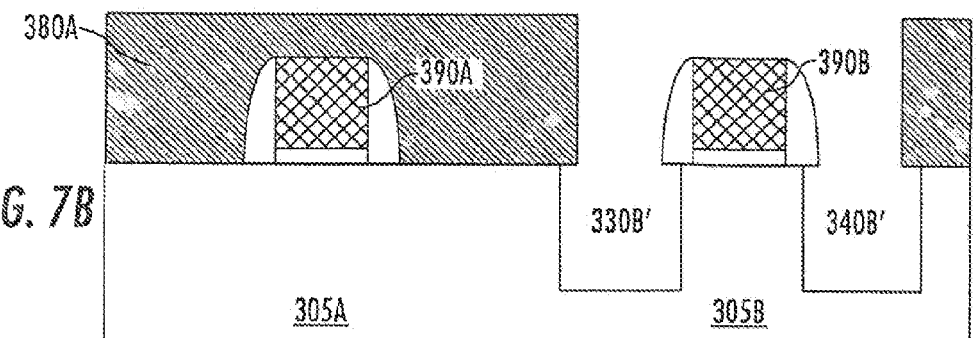

Referring to FIG. 7B, the exposed fin 305B is etched using a first etch process to define source/drain recesses 330B', 340B' therein. The etch process used to form the source/drain recesses 330B', 340B' may include a reactive ion etch process.

In particular, the etch process may result in a lateral etch so that the source/drain recesses extend partially beneath the sidewall spacers 352B.

Figure 7C:
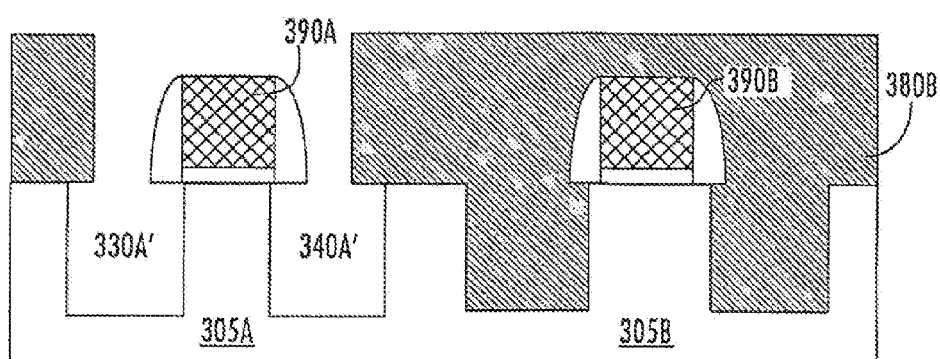

Referring to FIG. 7C, the etch mask 380A is removed, and a new etch mask 380B is formed on the substrate. The etch mask 380B exposes source/drain regions of the first structure 300A'.

The exposed fin 305A is then etched using a second etch process to define source/drain recesses 330A', 340A' therein. The etch process used to form the source/drain recesses 330A', 340A' may include a reactive ion etch process.

In particular, the etch process may result in a lateral etch so that the source/drain recesses extend partially beneath the sidewall spacers 352A. The lateral etching of the first structure 300A' may be different from the lateral etching of the second structure 300B'. Thus, the source/drain recesses 330A', 340A' in the first structure 300A' may extend a greater distance under the sidewall spacers 352A and the dummy gate structure 390A than the source/drain recesses 330B', 340B' in the second structure 300B' extend under the sidewall spacers 352B and the dummy gate structure 390B.

Figure 7D:
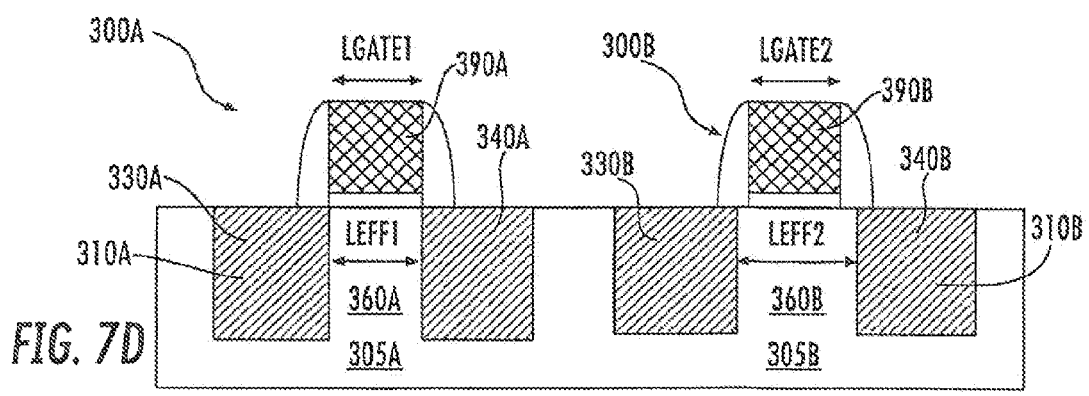

Referring to FIG. 7D, source/drain regions 330A, 340A, 330B, 340B may be formed through epitaxial regrowth in the source/drain recesses 330A', 340A' in the first structure 300A' and the source/drain recesses 330B', 340B' in the second structure 300B'. The epitaxial process used to grow the source/drain regions 330A, 340A, and the source/drain regions 330B, 340B may be the same or different. Similarly, the doping process used to dope the source/drain regions 330A, 340A, and the source/drain regions 330B, 340B may be the same or different.

Although the source/drain regions 330A, 340A, 330B, 340B are illustrated as being grown simultaneously, it will be appreciated that the source/drain regions 330B, 340B may be regrown before the source/drain recesses 330A', 340A' are formed, and the source/drain regions 330A, 340A may be grown separately from the source/drain recesses 330B, 340B. In that case, a thin film coating may be formed over the entire structure after formation of the source/drain regions 330B, 340B to discourage epitaxial growth over the source/drain regions 330B, 340B during regrowth of the source/drain regions 330A, 340A.

As a result of a difference in lateral etching rate, a difference in epitaxial growth conditions or materials and/or a difference in doping processes, the first and second finFET structures 300A, 300B may have different effective channel lengths Leff, although they may have the same or nearly the same gate lengths Lgate.

Figure 8A:
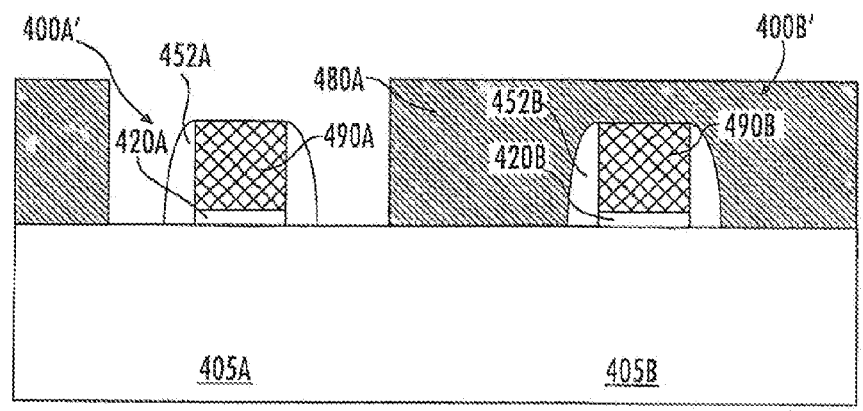
FIGS. 8A-8D are cross-sectional views illustrating stages of a method of manufacturing a finFET semiconductor device according to further embodiments.

Operations according to further embodiments are illustrated in FIGS. 8A to 8D. Referring to FIG. 8A, first and second precursor structures 400A', 400B' for finFET devices are formed on first and second fins 405A, 405B on a common substrate (not shown). The precursor structures 400A', 400B' include gate insulators 420A, 420B, dummy gates 490A, 490B, and sidewall spacers 452A, 452B that extend up and over the respective fins 405A, 405B. The second structure 400B' is covered with an etch mask 480A. The etch mask 480A (or a different etch mask) is formed to expose the source/drain regions of the first structure 400A'.

Figure 8B:
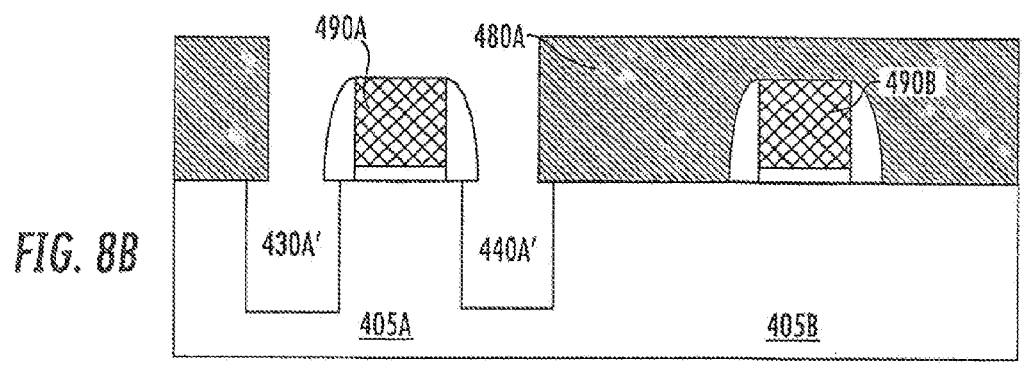

Referring to FIG. 8B, the exposed fin 405A is etched using a first etch process to define source/drain recesses 430A', 440A' therein. The etch process used to form the source/drain recesses 430A', 440A' may include a reactive ion etch process.

The etch process may result in a lateral etch so that the source/drain recesses extend partially beneath the sidewall spacers 452A, or may result in no lateral etch. In some embodiments, the etch process used to define the source drain recesses 430A', 440A' may be more anisotropic and result in a substantially vertical recess profile.

Figure 8C:
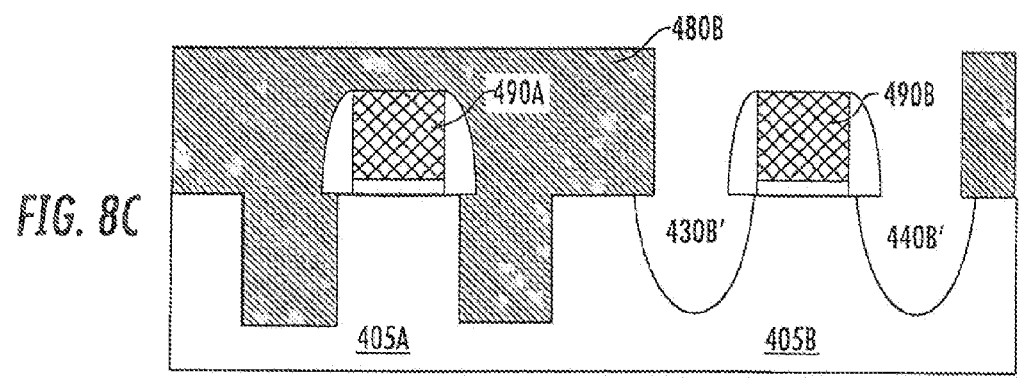

Referring to FIG. 8C, the etch mask 480A is removed, and a new etch mask 480B is formed on the substrate. The etch mask 480B exposes source/drain regions of the second structure 400B'.

The exposed fin 405B is then etched using a second etch process to define source/drain recesses 430B', 440B' therein. The etch process used to form the source/drain recesses 430B', 440B' may include a reactive ion etch process.

In particular, the etch process may result in a lateral etch so that the source/drain recesses extend partially beneath the sidewall spacers 452B. The lateral etching of the first structure 400A' may be different from the lateral etching of the second structure 400B'. Thus, the source/drain recesses 430B', 440B' in the second structure 400B' may have a more rounded profile. For example, the etch process used to form the source/drain recesses 430B', 440B' may be more isotropic than the etch process used to form the source/drain recesses 430A', 440A'.

Figure 8D:
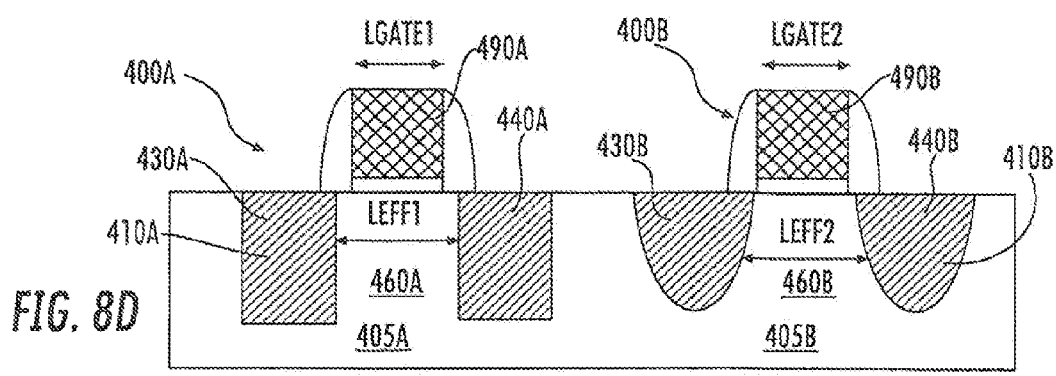

Referring to FIG. 8D, source/drain regions 430A, 440A, 430B, 440B may be formed through epitaxial regrowth in the source/drain recesses 430A', 440A' in the first structure 400A' and the source/drain recesses 430B', 440B' in the second structure 400B'. The epitaxial process used to grow the source/drain regions 430A, 440A, and the source/drain regions 430B, 440B may be the same or different. Similarly, the doping process used to dope the source/drain regions 430A, 440A, and the source/drain regions 430B, 440B may be the same or different.

As a result of a difference in etch profiles, a difference in epitaxial growth conditions or materials and/or a difference in doping processes, the first and second finFET structures 400A, 400B may have different effective channel lengths Leff, although they may have the same or nearly the same gate lengths Lgate.

The finFETs shown in the foregoing examples may include nFETs and/or pFETs.

In some embodiments, any spacer material adjacent to the fin in the source/drain regions may be removed prior to performing the fin recess etch in any of the finFET structures.

The source/drain regions of the finFET devices may be formed according to a source/drain epitaxial process that provides a desired doping profile and material composition. In general for nFET devices, the source/drain regions will be doped with n-type dopants, while for pFET devices, the source/drain regions will be doped with p-type dopants.

In some embodiments, a thin spacer may be formed by material deposition over the finFET structures.

After forming one or more finFET structures of a first type (e.g., nFET or pFET), the foregoing operations can be repeated for the other type of structure.

In some embodiments, combinations of different and/or same fin recess etch profiles may be used for each type of FET.

Moreover, different in-situ doped source/drain epitaxial processes, including, for example, different epitaxial material and composition, such as Si, Ge, SiGe, C, Sn and/or group III-V or II-VI elements maybe used to form the source/drain regions. The position, distribution, concentration and grading of dopants relative to the initial edge of the fin recess regions may be modified based on the doping process used to dope the source/drain regions, which may require further dielectric layer deposition steps. For example, in some embodiments, the source/drain regions may be doped using an ion implantation process with angled or halo implants that can place the dopants underneath the sidewall spacers.

Additional doping steps, e.g., implant or plasma doping, pre- or post-in-situ doped source/drain epitaxial processes may also be employed.

Figure 9:
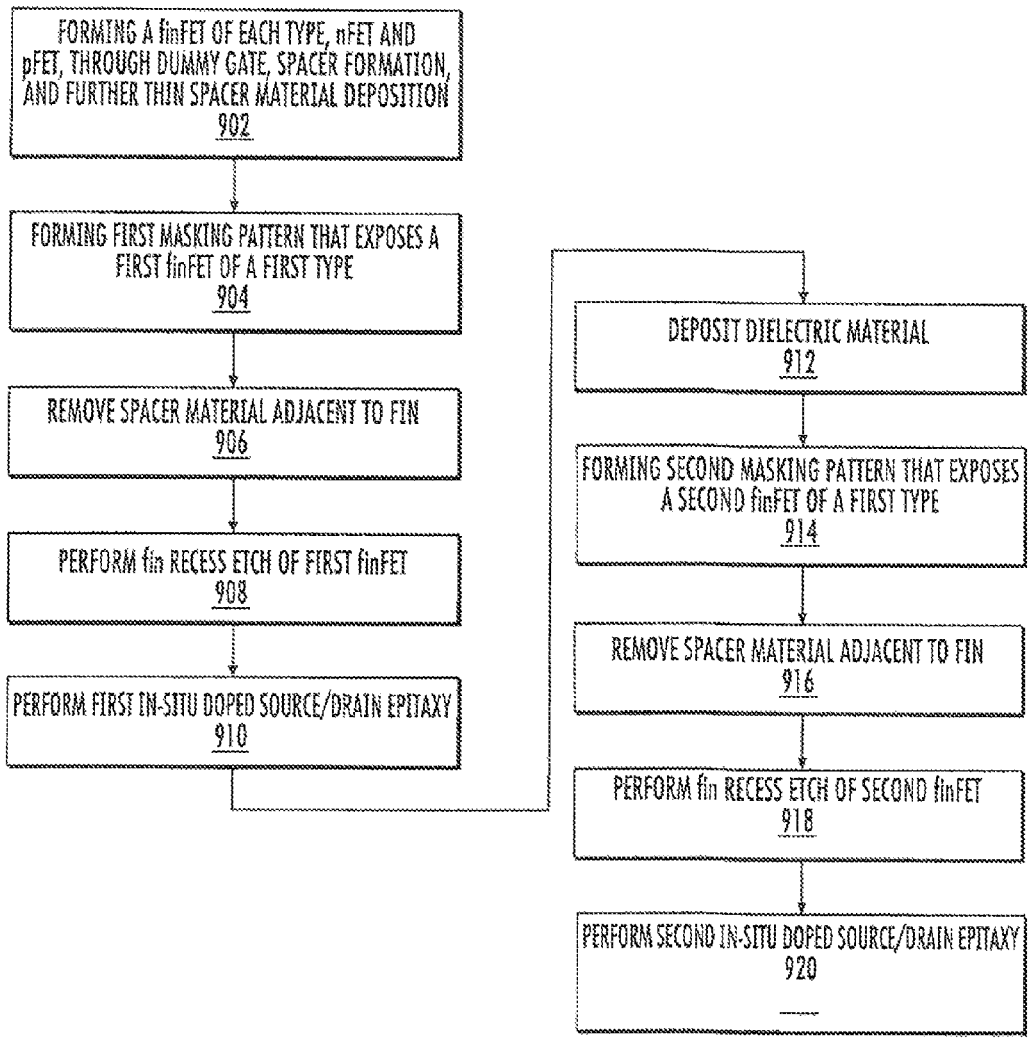
FIG. 9 is a flowchart illustrating operations associated with a finFET semiconductor device according to some embodiments.

Further embodiments with different in-situ doped source/drain epitaxial processes are illustrated in FIG. 9 and may include the following operations:

First, forming a finFET of each type, nFET and pFET, through dummy gate, spacer formation, and further thin spacer material deposition (block 902). Next, forming a first masking pattern that exposes a first finFET of a first type, e.g., nFET (block 904).

Any desired portion of spacer material adjacent to the fin in the source/drain region may then be removed (block 906), and a fin recess etch may be performed in the source/drain region of the first finFET (block 908).

The first masking pattern is removed, and a first in-situ doped source/drain epitaxial process of a desired doping profile and material composition is performed for the first finFET (block 910).

A dielectric is then deposited over the wafer, thus forming a dielectric over the region of the first in-situ doped source/drain epitaxial process (block 912).

A second masking pattern is then formed to expose a second finFET of a first type (block 914). Any desired portion of spacer material adjacent to the fin in the source/drain region may then be removed (block 916), and a fin recess etch may be performed in the source/drain region of the second finFET (block 918).

The second masking pattern is then removed, and a second in-situ doped source/drain epitaxial process is performed for the second finFET (block 920).

The foregoing operations may be repeated for finFETs of the second type, e.g., pFET.

As described herein, some embodiments provide a structure including a plurality of finFET devices, including a first finFET device of a first type (nFET or pFET) formed with a first fin recess and a first in-situ doped source/drain epitaxial material in the first fin recess to provide a first source/drain region and at least a second finFET device of the same type and having a second fin recess with a second in-situ doped source/drain epitaxial material in the second fin recess to provide a second source/drain region. The second fin recess may have the same or different dimensions as the first fin recess, and the first source/drain epitaxial material may be the same as or different from the second source/drain epitaxial material. The first finFET device and the second finFET device may have the same physical gate length but may have different effective channel lengths.

The first fin recess in the first source/drain region may have a first vertical recess and a first lateral recess, and the second fin recess in the second source/drain region may have a second vertical recess and a second lateral recess. The first fin recess in the first source/drain region may be the same as or different from the second fin recess in the second source/drain region.

In particular, the first fin recess in the first source/drain region may have a first lateral recess that is larger than a second lateral recess of the second fin recess in the second source/drain region.

In some embodiments, the first fin recess in the first source/drain region may have a first vertical recess that is more vertical than a second vertical recess of the second fin recess in the second source/drain region. That is, the second vertical recess may have a more rounded recess etch profile so that the distance between the source and drain regions in the second finFET device changes along the height of the second fin.

In some embodiments, the second finFET structure may not include a fin recess for the source/drain regions.

In some embodiments, a first in-situ source/drain doped epitaxial material growth may occur in the source/drain regions of the first finFET device after the first fin recess is formed, and a second in-situ source/drain doped epitaxial material growth may occur in the second source/drain regions of the second finFET device after the second fin recess is formed.

In some embodiments, the first in-situ source/drain doped epitaxial material growth may be performed at the same time as the second in-situ source/drain doped epitaxial material growth.

In some embodiments, the first in-situ source/drain doped epitaxial material growth may be performed according to a different process than the second in-situ source/drain doped epitaxial material growth. In particular, the first and second source/drain epitaxial growth processes may utilize different semiconductor material compositions and/or doping processes. For example, the first source/drain epitaxial growth process may incorporate more silicon or C in the first fin recess, while the second source/drain epitaxial growth process may incorporate more silicon germanium in the second fin recess. In particular embodiments, the source/drain epitaxial growth processes may form source/drain regions composed of an epitaxial semiconductor material including Si, Ge, SiGe, C, Sn and/or group III-V or II-VI elements.

In further embodiments, the position, distribution, concentration and/or grading of dopants may be different in the first and second source/drain regions. These differences may generally result in the first and second finFET devices having different effective channel lengths Leff.

Structures according to further embodiments may include a third finFET device having no fin recess in a third source/drain region. The first, second and third finFET devices may each have the same physical gate length.

In some embodiments, the second fin recess may be formed after the first in-situ source/drain doped epitaxial material is grown in the first fin recess.

In some embodiments, the second fin recess may be formed after deposition of layer of insulating material over the first source/drain regions subsequent to the growth of the first in-situ source/drain doped epitaxial material. The insulating layer deposition is to prevent further growth of source/drain epitaxial material in the first finFET associated with a subsequent source/drain epitaxial growth process for a second finFET.

In some embodiments, a doping step may precede the first and/or second in-situ source/drain doped epitaxial material growth processes.

A method of forming a semiconductor structure according to some embodiments includes forming a first masking pattern on a first fin of one type and forming a first fin recess in a first source/drain region of the first fin, forming a second masking pattern on a second fin and forming a second fin recess in a second source/drain region of the second fin. A third masking pattern may be formed on a third fin to remove spacer material adjacent to the third fin that is formed to discourage epitaxial growth over the first source/drain regions during regrowth of the second source/drain regions, but a third recess may not be formed in a third source/drain region of the third fin. A same in-situ source/drain epitaxial material growth step may then be performed to form source/drain regions on the first, second and third fins.

In some embodiments, a first masking pattern may be formed on a first fin and a first fin recess may be formed in a first source/drain region of the first fin. A second masking pattern may be formed on a second fin, and a second fin recess may be formed in a second source/drain region of the second fin. An in-situ source/drain epitaxial material growth step may then be performed to form source/drain regions in the first fin and the second fin.

According to some embodiments, a first masking pattern may be formed on a first fin and a first fin recess may be formed in a first source/drain region in the first fin, a second masking pattern may be formed on a second fin and a second fin recess may be formed in a second source/drain region of the second fin. Additionally, a third masking pattern may be formed on a third fin to remove spacer material adjacent to the third fin, but a third recess may not be formed in the third fin. Different in-situ source/drain epitaxial material growth steps may then be performed to form first, second and third source/drain regions on the first, second and third fins, respectively. The different source/drain epitaxial material growth process may form source/drain regions having different doping profiles and/or different growth conditions or material compositions including Si or Ge components.

In some embodiments, a first masking pattern is formed on a first fin and a first fin recess is formed in a first source/drain region of the first fin. A second masking pattern is formed on a second fin and a second fin recess is formed in a second source/drain region. Different source/drain epitaxial materials may then be grown in the first and second source/drain regions. The different source/drain epitaxial material growth may provide different doping profiles and/or compositions of source/drain material in the first and second source/drain regions, including Si or Ge components.

Some embodiments provide CMOS circuits including a first finFET and a second finFET having the same physical gate lengths and different effective channel lengths according to various embodiments described herein.

The terminology used herein is for the purpose of describing particular embodiments only and is not intended to be limiting of the inventive concept. As used herein, the singular terms "a," "an" and "the" are intended to include the plural forms as well, unless the context clearly indicates otherwise. As used herein, the term "and/or" includes any and all combinations of one or more of the associated listed items.

It will be understood that when an element such as a layer, region or substrate is referred to as being "on" another element, it can be directly on the other element or intervening elements may be present. It will be further understood that when an element such as a layer, region or surface is referred to as being "adjacent" another element, it can be directly adjacent the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concept. Example embodiments of aspects of the present inventive concept explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices, such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

While the inventive concept has been described with reference to some embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor structure, comprising:
a first finFET device including a first fin, a first gate electrode structure on sidewalls and an upper surface of the first fin, a first channel region beneath the first gate electrode structure, and first source and drain regions in the first fin on opposite sides of the first channel region, the first gate electrode structure including a first gate metal and first sidewall spacers; and
a second finFET device including a second fin, a second gate electrode structure on sidewalls and an upper surface of the second fin, a second channel region beneath the second gate electrode structure, and second source and drain regions in the second fin on opposite sides of the second channel region, the second gate electrode structure including a second gate metal and second sidewall spacers;
wherein the first finFET device and the second finFET device have a same device type;
wherein the first gate electrode structure has a first physical gate length Lgate1 and the second gate electrode structure has a second physical gate length Lgate2 that is substantially the same as the first physical gate length Lgate1;
wherein the first finFET device has a first effective channel length Leff1 and the second finFET device has a second effective channel length Leff2 that is different from the first effective channel length Leff1;
wherein the first source and drain regions are nrovided in first fin recesses in the first fin and the second source and drain regions are provided in second fin recesses in the second fin, wherein each of the first fin recesses has a first vertical extent and a first lateral extent, wherein each of the second fin recesses has a second vertical extent and a second lateral extent: and
wherein each of the first fin recesses in the first fin is more vertical than the second fin recesses in the second fin, and wherein each of the second fin recesses has a more rounded recess etch profile than the first fin recesses, wherein the second fin recesses are rounded away from the second gate electro e structure to increase an average effective channel length of the second finFET device along a height of the second fin.

2. The semiconductor structure of claim 1, wherein the second effective channel length Leff2 is at least about 10% to 30% longer than. the first effective channel length Leff1.

3. The semiconductor structure of claim 1, wherein, each of the first source and drain regions extends underneath the first gate electrode structure by a first distance that is greater than a second distance by which the second source and drain regions extend underneath the second gate electrode structure.

4. The semiconductor structure of claim 1, wherein second source and drain regions have a rounded profile adjacent to the second channel region from a top of the second fin towards a bottom of the second fin.

5. The semiconductor structure of claim 1, wherein the first source and drain regions have a first net doping concentration that is different than a second net doping concentration of the second source and drain regions.

6. The semiconductor structure of claim 1, wherein the second lateral extent is different from the first lateral extent.

7. The semiconductor structure of claim 1, wherein each of the first fin recesses in the first fin has the same size as the second fin recesses in the second fin.

8. The semiconductor structure of claim 1, wherein the second lateral extent of each of the second fin recesses is larger than the first lateral extent of each of the first fin recesses.

9. The semiconductor structure of claim 1, wherein the first source and drain regions differ from the second source and drain regions by one or more of i) epitaxial material composition, and ii) position, distribution, concentration and/or grading of dopants relative to a position of gate electrodes, such that the first and second finFET devices have different effective channel lengths.

* * * * *